United States Patent
Deng et al.

(10) Patent No.: US 11,444,129 B2
(45) Date of Patent: Sep. 13, 2022

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yin Deng, Beijing (CN); Bo Wu, Beijing (CN); Xiaojing Qi, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 732 days.

(21) Appl. No.: 16/330,522

(22) PCT Filed: May 25, 2018

(86) PCT No.: PCT/CN2018/088433
§ 371 (c)(1),
(2) Date: Mar. 5, 2019

(87) PCT Pub. No.: WO2019/041910
PCT Pub. Date: Mar. 7, 2019

(65) Prior Publication Data
US 2021/0367002 A1 Nov. 25, 2021

(30) Foreign Application Priority Data
Aug. 29, 2017 (CN) .......................... 201710756459.8

(51) Int. Cl.
*H01L 27/146* (2006.01)
*H01L 27/32* (2006.01)
(Continued)

(52) U.S. Cl.
CPC .... *H01L 27/3218* (2013.01); *G02F 1/136209* (2013.01); *H01L 27/326* (2013.01); *H01L 51/5284* (2013.01)

(58) Field of Classification Search
CPC ................... H01L 27/14603; H01L 27/14605
See application file for complete search history.

(56) References Cited

U.S. PATENT DOCUMENTS 8,711,317 B2    4/2014  Nonaka
10,409,118 B1 *  9/2019  Chang ............... G02F 1/133308
(Continued)

FOREIGN PATENT DOCUMENTS

CN    101887189 A    11/2010
CN    103941481 A     7/2014
(Continued)

OTHER PUBLICATIONS

The International Search Report and Written Opinion dated Aug. 24, 2018; PCT/CN2018/088433.

*Primary Examiner* — Jae Lee (57) ABSTRACT

A display panel a display device are provided. The display panel includes a plurality of pixel units arranged in a row direction and in a column direction, the display panel includes a display region. An edge of the display region includes a fold line formed by connecting a line segment extending in the row direction and a line segment extending in the column direction, a parallelogram region formed in the display region taking two adjacent line segments as adjacent sides includes the pixel units; directions from an intersection point of the two adjacent line segments to end points of the two adjacent line segments other than those at the intersection point are a first direction and a second direction, respectively; in the parallelogram region, aperture (Continued)

ratios of the pixel units arranged in at least one of the first direction and the second direction increase gradually.

13 Claims, 7 Drawing Sheets

(51) Int. Cl.
*G02F 1/1362* (2006.01)
*H01L 51/52* (2006.01)

(56) References Cited

U.S. PATENT DOCUMENTS

| | | |
|---|---|---|
| 2010/0141874 A1 | 6/2010 | Morita |
| 2015/0002803 A1 | 1/2015 | Qin et al. |
| 2018/0337217 A1 | 11/2018 | Zang et al. |
| 2019/0011786 A1 | 1/2019 | Liu et al. |
| 2019/0096961 A1* | 3/2019 | Jin ..................... H01L 27/3218 |

FOREIGN PATENT DOCUMENTS

| | | |
|---|---|---|
| CN | 105511152 A | 4/2016 |
| CN | 107167957 A | 9/2017 |
| CN | 107507522 A | 12/2017 |

* cited by examiner

DISPLAY PANEL AND DISPLAY DEVICE

CROSS-REFERENCE TO RELATED APPLICATION

The application claims priority to the Chinese patent application No. 201710756459.8, filed on Aug. 29, 2017, the entire disclosure of which is incorporated herein by reference as part of the present application.

TECHNICAL FIELD

At least one embodiment of the present disclosure relates to a display panel and a display device.

BACKGROUND

With an expansion of application fields of display products, some display manufacturers have begun to design and produce a display product with an irregular display region, that is, a shape of the display region and a shape of a display substrate thereof are non-rectangular shapes, such as a circular or a polygon, etc. The display effect of a display device having an irregular display region needs to be improved.

SUMMARY

At least one embodiment of the present disclosure provides a display panel, and the display panel includes a plurality of pixel units arranged in a row direction and in a column direction. The display panel includes a display region, an edge of the display region includes a fold line formed by connecting a line segment extending in the row direction and a line segment extending in the column direction, a parallelogram region formed in the display region taking two adjacent line segments as adjacent sides includes a plurality of rows and at least one column of the pixel units, or at least one row and a plurality of columns of the pixel units; directions from an intersection point of the two adjacent line segments to end points of the two adjacent line segments other than those at the intersection point are a first direction and a second direction, respectively; in the parallelogram region, aperture ratios of the pixel units arranged in at least one selected from the group consisting of the first direction and the second direction increase gradually.

For example, the row direction and the column direction are perpendicular to each other, and the parallelogram region is a rectangular region.

For example, each of the pixel units includes a plurality of sub-pixels of multiple colors arranged in the row direction, and in the parallelogram region, aperture ratios of the sub-pixels having a same color arranged in at least one selected from the group consisting of the first direction and the second direction increase gradually.

For example, each of the pixel units includes a plurality sub-pixels of multiple colors arranged in the row direction, and in the parallelogram region, each sub-pixel in each of the pixel units has a same aperture ratio.

For example, an overlapping portion of an edge of the parallelogram region and the edge of the display region includes one first line segment extending in the row direction and two second line segments extending in the column direction; in the parallelogram region, two end points of the first line segment are respectively connected with the two second line segments, and in a direction from any end point of the first line segment to a midpoint of the first line segment, the aperture ratios of the pixel units increase gradually.

For example, each of the pixel units in the parallelogram region includes a light-shading structure, and light-shading areas of light-shading structures of the pixel units arranged in at least one selected from the group consisting of the first direction and the second direction decrease gradually, so that the aperture ratios increase gradually.

For example, a light-shading layer is between adjacent ones of the pixel units, and a material of the light-shading structure is the same as a material of the light-shading layer.

For example, the light-shading structure includes at least one sub light-shading structure extending in the column direction, and the sub light-shading structure has a same shape and a same size as a sub light-shading layer extending in the column direction included in the light-shading layer.

For example, the light-shading structure includes a plurality of sub light-shading structures each of which extends in the column direction, and in the row direction, the plurality of sub light-shading structures are arranged continuously or spaced apart from each other.

For example, the light-shading structure includes at least one first sub light-shading structure extending in the row direction and at least one second sub light-shading structure extending in the column direction.

For example, the light-shading structure includes a plurality of first sub light-shading structures, and in the column direction, the plurality of first sub light-shading structures are arranged continuously or spaced apart from each other.

For example, the light-shading structure includes a plurality of second sub light-shading structures, and in the row direction, the plurality of second sub light-shading structures are arranged continuously or spaced apart from each other.

For example, a shape of the display region includes a non-rectangular shape.

At least one embodiment of the present disclosure further provides a display device, and the display device includes the display panel provided by any one of the embodiments of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "On," "under," "left," "right" and the like are only used to indicate relative position relationship, and when the position of the object which is described is changed, the relative position relationship may be changed accordingly.

Figure 1A:
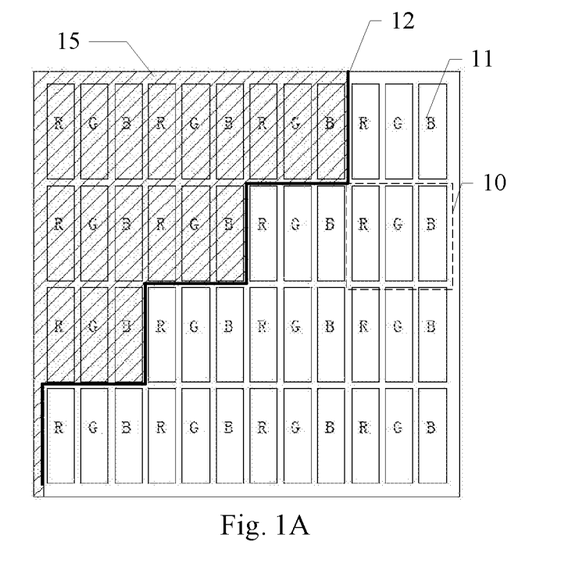
FIG. 1A is a schematic diagram of a partial display panel in a design of a linear light-shading layer structure.
Figure 1B:
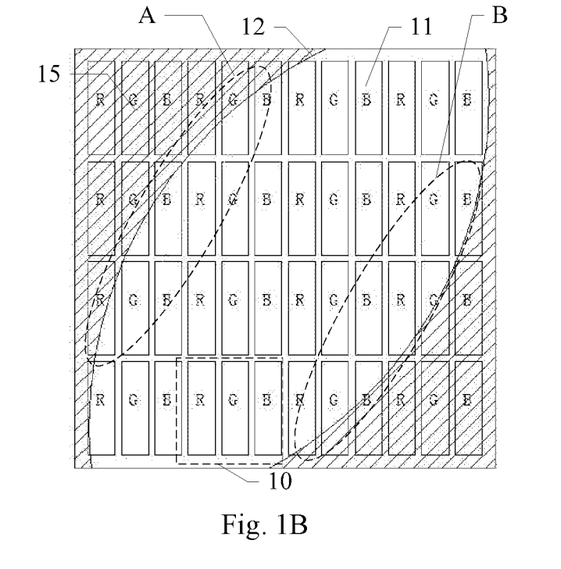
FIG. 1B is a schematic diagram of a partial display panel in a design of a light-shading layer structure with a curved edge.

FIG. 1A and FIG. 1B illustrate two design modes aiming at a light-shading layer of an irregular display region. FIG. 1A is a schematic diagram of a partial display panel in a design of a linear light-shading layer structure. As illustrated in FIG. 1A, a shadow region is a non-display region provided with a light-shading layer 15, a blank region is a display region including a plurality of pixel units 10 arranged in an array, and each of the pixel units 10 includes three sub-pixels 11 of red, green and blue (RGB). A boundary 12 between the light-shading layer 15 and the display region is in a sawtooth shape, the light-shading layer 15 with a sawtooth shape edge as illustrated in FIG. 1A is designed at an edge of the display region so as to form a display region that exhibits a non-rectangular shape, such as a circle or a polygon as a whole, and for example, a display effect that the edge of the display region is approximately a curved edge is achieved.

In order to make it convenient for designing, a pixel structure in the display region is usually in a conventional array structure, thus, a design of a light-shading layer structure at a position where the display region is in contact with a non-display region is required to achieve a display effect having a non-rectangular shape. In the study, inventor (s) of the present disclosure notices that upon the display panel designed by adopting the design scheme illustrated in FIG. 1A playing a function of display, a user may clearly see the sawtooth shape of a display image at the edge of the display region, thus the user's viewing experience is affected.

FIG. 1B is a schematic diagram of a partial display panel in a design of a light-shading layer structure with a curved edge. As illustrated in FIG. 1B, the display panel is described by taking a case that an edge of the light-shading layer 15 is designed according to a curved edge actually required by the display region, and the curved edge of the light-shading layer 15 herein can avoid a case where the edge of the display region is in a sawtooth shape.

However, inventor(s) of the present disclosure notices that the edge of the light-shading layer 15 is not in an edge of the pixel units 10, the light-shading layer 15 have different light-shading areas for each of the sub-pixels 11 in the same pixel unit 10, thus in a user's eyes, a color mixing ratio produced by the pixel units 10 at the edge of the display region is affected by a position of the light-shading layer 15.

As illustrated in FIG. 1B, in one pixel 10 in a region A, an area of the red sub-pixel (R) 11 shaded by the light-shading layer 15 is larger than an area of the green sub-pixel (G) 11 and an area of the blue sub-pixel (B) 11 shaded by the light-shading layer 15, thus users see a bluish display image from the region A; however, in one pixel 10 in a region B, an area of the blue sub-pixel (B) 11 shaded by the light-shading layer 15 is larger than an area of the green sub-pixel (G) 11 and an area of the red sub-pixel (R) 11 shaded by the light-shading layer 15, thus users see a reddish display image from the region B. Thus, existence of a color cast problem mentioned above may affect the users' viewing experience.

Figure 1C:
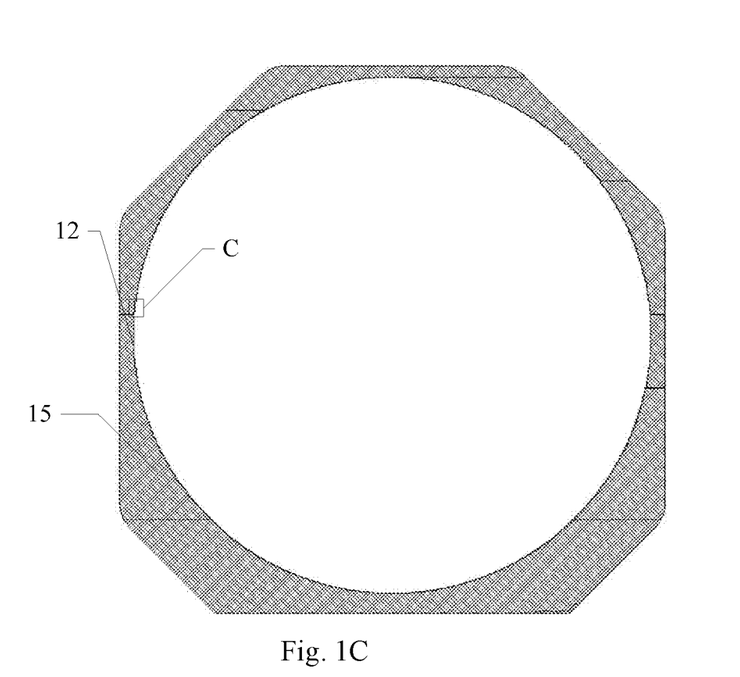
FIG. 1C is a planar view of an entire structure a display panel.
Figure 1D:
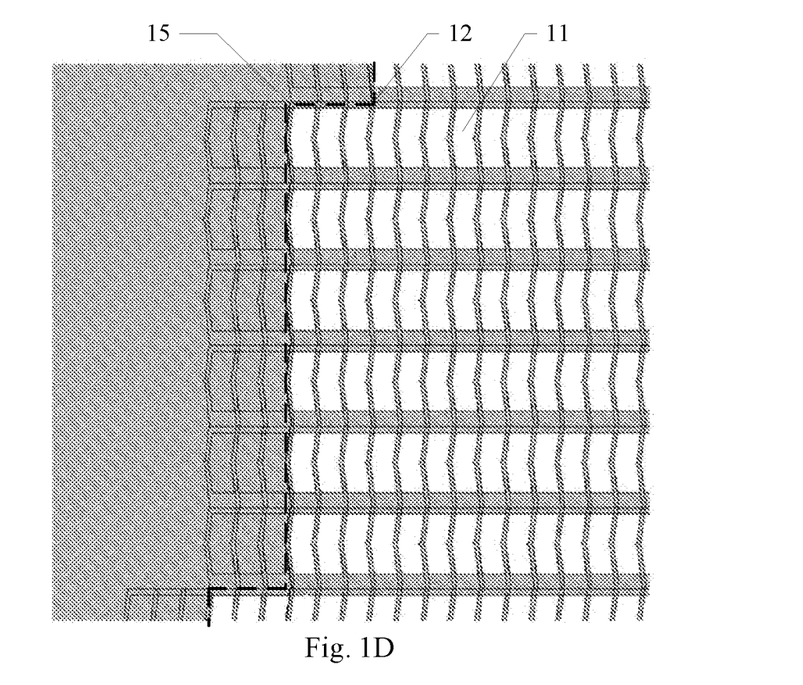
FIG. 1D is an amplified view of a region C in the display panel illustrated in FIG. 1C.

FIG. 1C is a planar view of an entire structure a display panel, and FIG. 1D is an amplified schematic diagram of a region C in the display panel illustrated in FIG. 1C. As illustrated in FIG. 1C and FIG. 1D, a design scheme where the light-shading layer 15 with a linear edge is adopted, that is, the boundary between the light-shading layer 15 and the edge of the display region is in a sawtooth shape, thus, a structure in a fine sawtooth shape at the edge of the display region in FIG. 1C can be seen. A shape of the display region is approximately circular. Upon the display panel playing a function of display, users can clearly see the sawtooth shape of the display image at the edge of the display region, thus the users' viewing experience is affected.

At least one embodiment of the present disclosure provides a display panel and a display device, and the display panel includes a plurality of pixel units arranged in a row direction and in a column direction. The display panel includes a display region, an edge of the display region includes a fold line formed by connecting a line segment extending in the row direction and a line segment extending in the column direction. A parallelogram region formed in the display region taking two adjacent line segments as adjacent sides includes a plurality of rows and at least one column of the pixel units, or at least one row and a plurality of columns of the pixel units arranged along the row direction and a plurality of columns of the pixel units arranged along a column direction; directions from an intersection point of the two adjacent line segments to end points of the two adjacent line segments other than those at the intersection point are a first direction and a second direction, respectively; in the parallelogram region, aperture ratios of the pixel units arranged in the first direction or/and the second direction increase gradually. The display panel provided by at least one embodiment of the present disclosure can weaken a sawtooth shape at the edge of the display region, so that when the display region plays a function of display, the sawtooth shape at the edge of the display region is hardly seen, thus a visual effect of the display region can be improved.

Figure 2A:
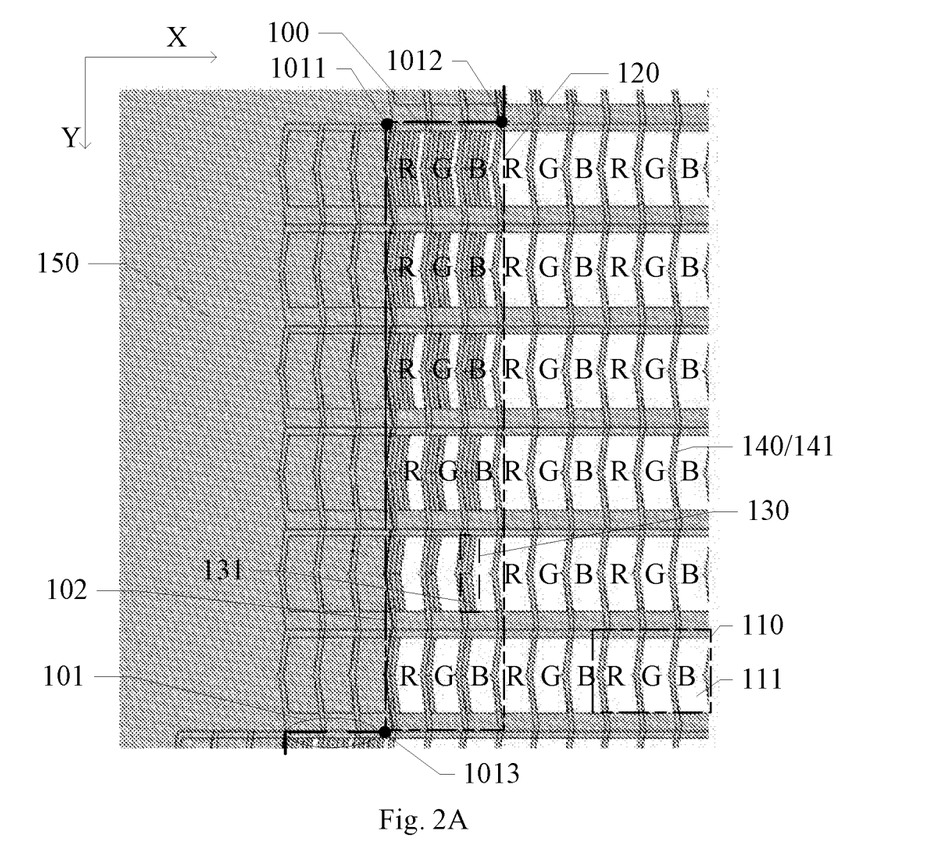
FIG. 2A is a partial planar view of an edge of a display region in a display panel provided by an embodiment of the present disclosure.

FIG. 2A is a partial planar view of an edge of a display region in a display panel provided by at least one embodiment of the present disclosure. As illustrated in FIG. 2A, the display panel includes: a plurality of pixel units 110 arranged in a row direction and in a column direction. The row direction is a direction parallel to an X direction, and the column direction is a direction parallel to a Y direction herein. The display panel includes a display region 100, and an edge of the display region 100 includes a fold line formed by a line segment 101 and a line segment 102 (a first line segment 101 extending in the row direction and a second line segment 102 extending in the column direction), the line segment 101 is connected with the line segment 102. A boundary between the display region 100 and a non-display region shaded by a first light-shading layer 150 is the fold line formed by connecting the first line segment 101 and the second line segment 102, and for example, the fold line is in a sawtooth shape as illustrated in FIG. 2A, thus the edge of the display region 100 is in a sawtooth shape surrounded by the fold line. A parallelogram region 120 formed in the display region 100 taking two adjacent line segments which are the first line segment 101 and the second line segment 102 as adjacent sides includes a plurality of rows of the pixel units 110 and at least one column of the pixel units 110, or the parallelogram region 120 includes at least one row of the pixel units 110 and a plurality of columns of the pixel units 110, and FIG. 2A illustrates an example where the parallelogram region 120 includes a plurality of rows and one column of the pixel units 110. Directions from an intersection point 1011 of the two adjacent line segments 101, 102 to end points (for example, an end point 1012 of the first line segment 101 and an end point 1032 of the second line segment 102) of the two adjacent line segments 101, 102 other than those at the intersection point 1011 are respectively a first direction and a second direction.

For example, at least one embodiment is described by taking a direction from the intersection point 1011 to a first end point 1012 (a direction indicated by an arrow in the X direction) as the first direction and a direction from the intersection point 1011 to the second end point 1013 (a direction indicated by an arrow in the Y direction) as the second direction. The embodiment is not limited thereto, and the first direction and the second direction are interchangeable. In the parallelogram region 120, aperture ratios of the pixel units 110 arranged in the first direction or/and aperture ratios of the pixel units 110 arranged in the second direction increase gradually, so that upon the parallelogram region 120 at the edge of the display region 100 playing a function of display, an overall sawtooth sensation of the parallelogram region 120 is weakened. That is, a sawtooth shape at the edge of the display region 100 is hardly seen, thus a visual effect of the display region is improved.

Generally, upon the display region 100 playing a function of display, the more rows or columns of the pixel units 110 in the parallelogram region 120, the higher luminous brightness in the parallelogram region 120, thus, users can obviously feel the sawtooth shape at the edge of display region 100. Because two adjacent sides of the parallelogram region 120 are exactly on the fold line (the first line segment 101 and the second line segment 102) of the display region 100, thus when the display region 100 plays the function of display, the higher the brightness of the pixel units 110 which are close to the intersection point 1011 of the two adjacent sides, the more clearly the shape of an angle between the two adjacent sides is displayed, so that the user obviously feels the sawtooth shape.

In the parallelogram region 120 of at least one embodiment of the present disclosure, aperture ratios of the pixel units 110 arranged in the first direction or/and aperture ratios of the pixel units 110 arranged in the second direction increase gradually (in FIG. 2A, only in the second direction, aperture ratios of the pixel units increase gradually), that is, in the parallelogram region 120, the closer to the intersection point 1011 of the two adjacent line segments in the fold line of the edge of the display region 100, the smaller the aperture ratio of the pixel unit 110. Thus, when the display region plays a function of display, the sawtooth shape at the edge of the display region can be weakened by adjusting the aperture ratios of the pixel units at the edge of the display region, so that the sawtooth shape at the edge of the display region is hardly recognized by naked eyes.

For example, a shape of the display region 100 in at least one embodiment of the present disclosure includes a non-rectangular shape. For example, the shape of the display region 100 may include an irregular shape, such as an approximate circular, an approximate polygon, etc., thus, the display panel provided by at least one embodiment of the present disclosure takes an irregular display panel as an example.

For example, as illustrated in FIG. 2A, the row direction and the column direction are perpendicular to each other, that is, an angle between the two adjacent line segments respectively extending in the row direction and extending in the column direction at the edge of the display region 100 is a right angle, that is, an angle between the first line segment 101 and the second line segment 102 is a right angle, thus the parallelogram region 120 formed in the display region 100 taking the two adjacent line segments as the adjacent sides is a rectangular region. For example, the row direction and the column direction are interchangeable in embodiments of the present disclosure.

For example, as illustrated in FIG. 2A, in at least one embodiment of the present disclosure, the fold line formed by connecting the line segments respectively extending in the row direction and the column direction is extended in an edge of the pixel unit 110 at the edge of the display region 100. For example, because the edge of the pixel unit may not be a strictly straight line segment, the above mentioned line segments are basically in the edge of the pixel unit.

For example, as illustrated in FIG. 2A, in at least one embodiment of the present disclosure, the pixel units 110 are designed in a dual-domain mode, and at least one embodiment of the present disclosure includes but is not limited thereto. For example, the pixel units 110 are designed in a single domain mode.

For example, the display panel is described by taking a case that the parallelogram region 120 illustrated in FIG. 2A includes a column and six rows of the pixel units 110. In the parallelogram region 120, aperture ratios of the pixel units 110 arranged in the second direction (the Y direction) are different.

For example, in a case where an amount of rows of the pixel units 110 included in the parallelogram region 120 is less, aperture ratios of two adjacent rows of the pixel units 110 can be different, so that a change trend that the aperture ratios of the pixel units 110 in the second direction increase gradually is achieved, thus the sawtooth shape at the edge of the display region 100 can be weakened better.

For example, in the parallelogram region 120, in at least one selected from the group consisting of the first direction and the second direction, differences of the aperture ratios (differences of transparent areas) between any two adjacent pixel units 110 are equal, and at least one embodiment of the present disclosure includes but is not limited thereto.

For example, as illustrated in FIG. 2A, in the parallelogram region 120 in an example of an embodiment of the present disclosure, a case where the aperture ratios of the pixel units 110 are gradually increased in the second direction includes the following example. For example, six rows of the pixel units 110 are arranged in the Y direction, in the pixel unit 110 of a first row, an opening area is 1/6 of a total area; in the pixel unit 110 of a second row, an opening area of is 2/6 of a total area; in the pixel unit 110 of a third row, an opening area is 2/6 of a total area; in the pixel unit 110 of a fourth row, an opening area is 3/6 of a total area; in the pixel unit 110 of a fifth row, an opening area is 4/6 of a total area; in the pixel unit 110 of a sixth row, an opening area is 5/6 of a total area. A distribution mode of the aperture ratios is not limited to the above mentioned mode, as long as it desires that in the parallelogram region 120, in the second direction, the change trend of the aperture ratios of the pixel units 110 is gradually increased.

Figure 2B:
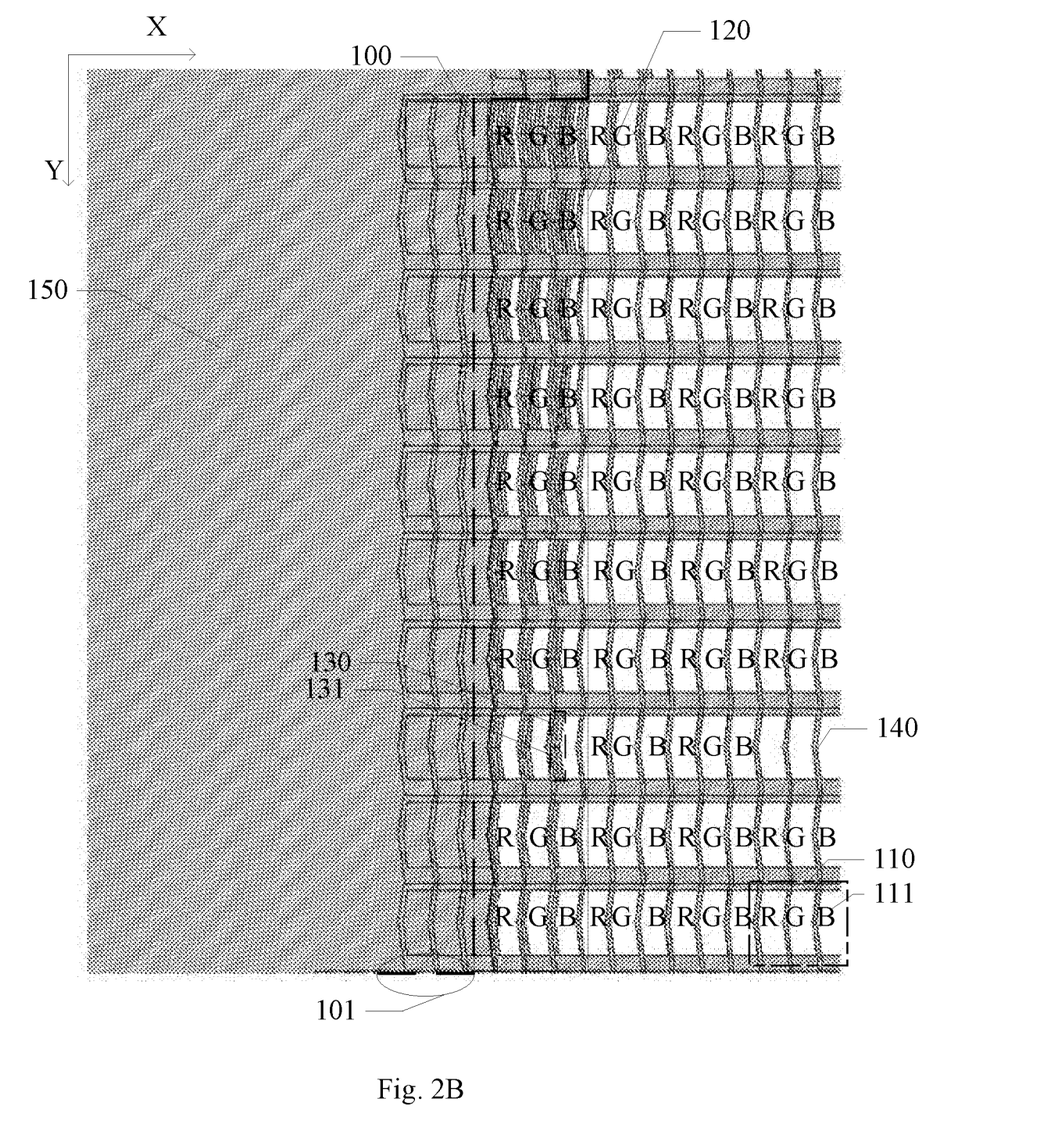
FIG. 2B is a partial planar view of an edge of a display region in a display panel provided by an example of an embodiment of the present disclosure.

For example, FIG. 2B is a partial planar view of an edge of a display region in a display panel provided by another example of an embodiment of the present disclosure. As illustrated in FIG. 2B, in a case where an amount of rows of the pixel units 110 included in the parallelogram region 120 is greater, two or three adjacent rows of the pixel units 110 may have the same aperture ratio, thus in the second direction, an overall change trend of the aperture ratios of the pixel units 110 is gradually increased.

For example, the display panel is described by taking a case that the parallelogram region 120 illustrated in FIG. 2B includes a column and ten rows of the pixel units 110. As illustrated in FIG. 2B, the case where the aperture ratios of the pixel units 110 increase gradually in the second direction includes the following example. For example, the ten rows of pixel units 110 are arranged in the Y direction, in the pixel unit 110 of a first row and a second row, an area of an opening is 1/6 of a total area; in the pixel unit 110 of a third row and a fourth row, an area of an opening is 2/6 of a total area; in the pixel unit 110 of a fifth row and a sixth row, an area of an opening is 3/6 of a total area; in the pixel unit 110 of a seventh row and a eighth row, an area of an opening is 4/6 of a total area; and in the pixel unit 110 of a ninth row and a tenth row, an area of an opening is 5/6 of a total area. The distribution mode of the aperture ratios is not limited to the above mentioned mode, and the aperture ratios of each row of the pixel units 110 and the amount of rows of the pixel units 110 with the same aperture ratio are designed according to the amount of the rows of the pixel units 110 in the parallelogram region 120.

Figure 2C:
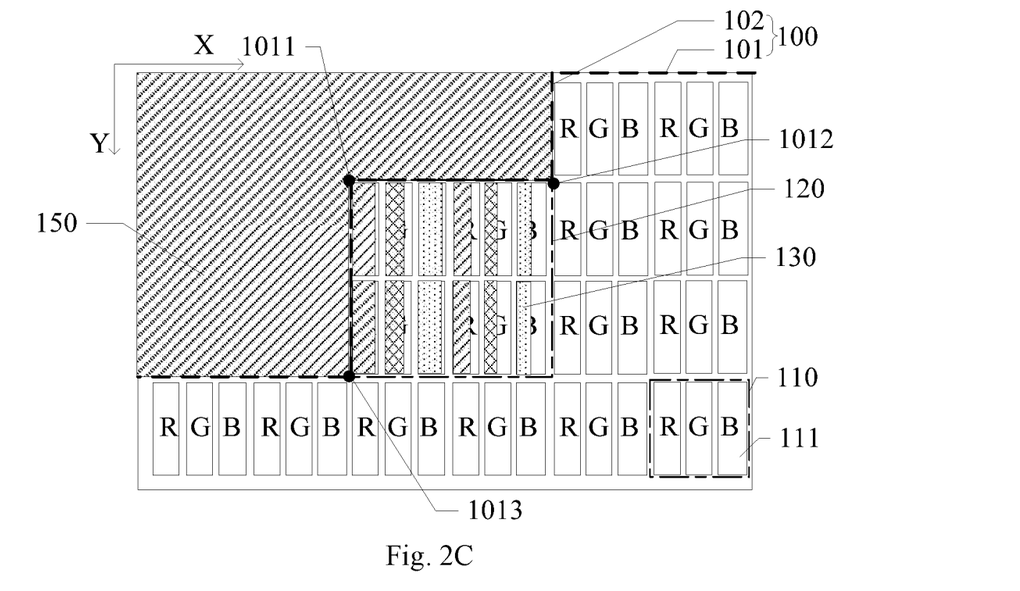
FIG. 2C is a partial planar view of an edge of a display region in a display panel provided by another example of an embodiment of the present disclosure.

For example, FIG. 2C is a partial planar view of an edge of a display region in a display panel provided by another example of an embodiment of the present disclosure, and in this example, a single domain design of the pixel units 110 is only schematic, a specific structure of the pixel units 110 can be designed according to actual requirements.

For example, as illustrated in FIG. 2C, each of the pixel units 110 includes a plurality of sub-pixels 111 of multiple colors arranged in the row direction (that is, the direction parallel to the X direction).

For example, as illustrated in FIG. 2C, each of the pixel units 110 provided by at least one embodiment of the present disclosure includes sub-pixels 111 of three colors which are red, green and blue (RGB), but the sub-pixels 111 are not limited thereto.

For example, as illustrated in FIG. 2C, in the parallelogram region 120, in at least one selected from the group consisting of the first direction the second direction, for example, the first direction (the X direction) is taking as an example for description, aperture ratios of the sub-pixels 111 having the same color increase gradually. In the parallelogram region 120 in FIG. 2C, filling patterns of the light-shading layers covering the sub-pixels 111 having different colors are different, so that shading of the light-shading layers on the sub-pixels 111 having different colors is clearly illustrated.

For example, in the first direction, aperture ratios of blue (B) sub-pixels 111 increase gradually.

For example, in the first direction, aperture ratios of green (G) sub-pixels 111 increase gradually.

For example, in the first direction, aperture ratios of red (R) sub-pixels 111 increase gradually.

In the parallelogram region 120, the aperture ratios of the pixel units arranged in at least one selected from the group consisting of the first direction and the second direction increase gradually by controlling the aperture ratios of the sub-pixels 111 having the same color in at least one selected from the group consisting of the first direction and the second direction, so that a color cast problem in the parallelogram region can be reduced.

Figure 2D:
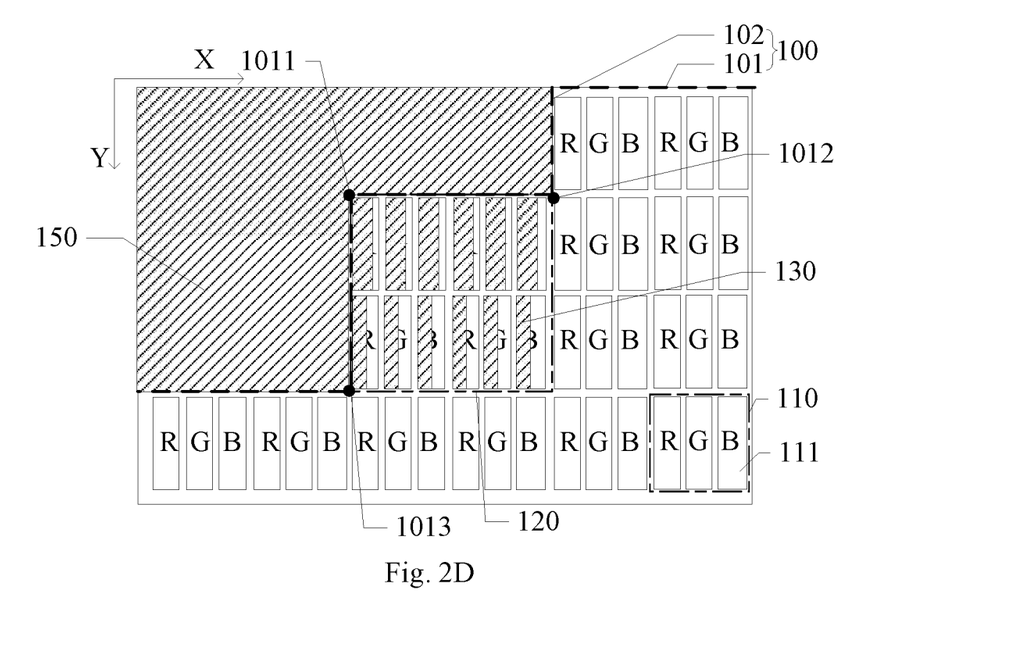
FIG. 2D-FIG. 2F are partial planar views of an edge of a display region in a display panel provided by further another example of an embodiment of the present disclosure.
Figure 2E:
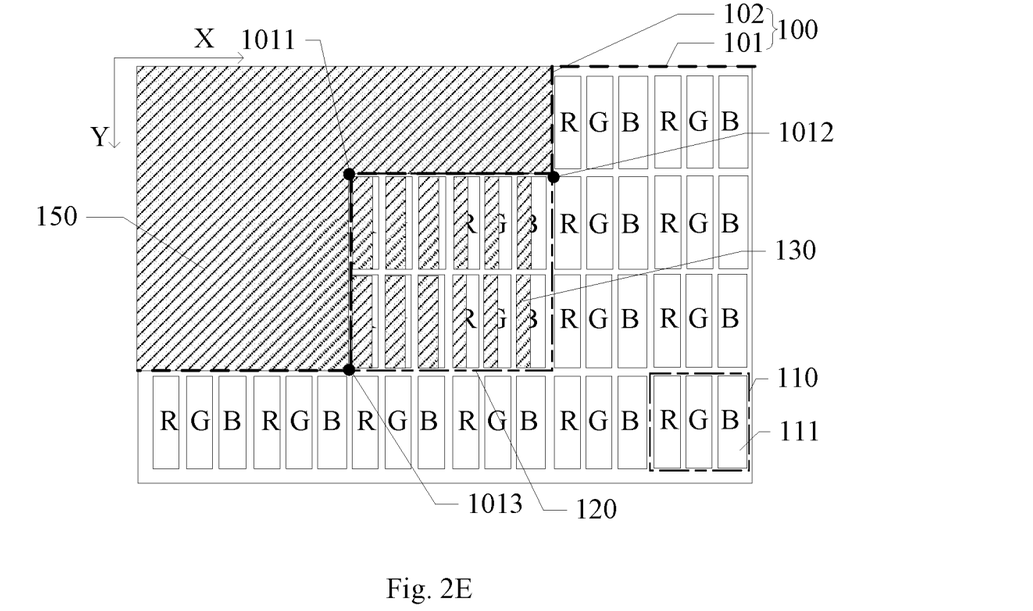
Figure 2F:
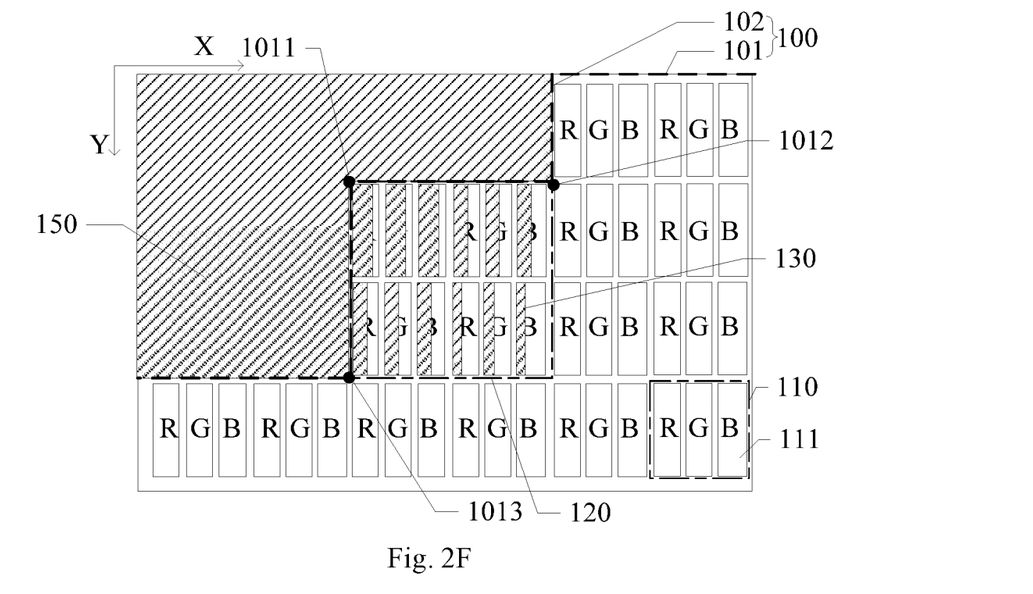

FIG. 2D-FIG. 2F are partial planar views of an edge of a display region in a display panel provided by further another example of an embodiment of the present disclosure. For example, as illustrated in FIG. 2D, in the parallelogram region 120, each sub-pixel 111 in each of the pixel units 110 has the same aperture ratio.

For example, the display panel is illustrated by taking a case that each of the pixel units 110 in the parallelogram region 120 includes sub-pixels 111 of three colors which are red, green and blue (RGB), thus aperture ratios of the sub-pixels 111 of the three colors in each of the pixel units 110 are the same, but the embodiment of the disclosure is not limited thereto, and for example, each of the pixel units in the parallelogram region can also include sub-pixels of two colors or four colors.

On one hand, because an edge of the first light-shading layer 150 is basically in the edge of the pixel units 110 in at least one embodiment of the present disclosure, a light-shading area of a region, shaded by the first light-shading layer 150, of each of the sub-pixels 111 in the same pixel unit 110 are the same; on the other hand, because the aperture ratios of the sub-pixels 111 in each of the pixel units 110 are the same, problems of color cast cannot exist at the edge of the display region 100, so that a yield and display quality of the display panel are improved.

For example, as illustrated in FIG. 2D, the parallelogram region 120 in at least one embodiment of the present disclosure includes the pixel units 110 arranged in a plurality of rows and a plurality of columns, and for example, the parallelogram region 120 includes the pixel units 110 arranged in two rows and two columns. In the example illustrated in FIG. 2D, the aperture ratios of the pixel units 110 arranged in the second direction increase gradually, and the aperture ratios of the pixel units 110 arranged in the first direction remain unchanged.

For example, as illustrated in FIG. 2E, the parallelogram region 120 in at least one embodiment of the present disclosure includes a plurality of rows and a plurality of columns of the pixel units 110, and for example, the parallelogram region 120 includes two rows and two columns of the pixel units 110. In the example illustrated in FIG. 2E, the aperture ratios of the pixel units 110 arranged in the first direction increase gradually, and the aperture ratios of the pixel units 110 arranged in the second direction remain unchanged.

For example, as illustrated in FIG. 2F, the parallelogram region 120 in at least one embodiment of the present disclosure includes a plurality of rows and a plurality of columns of the pixel units 110, and for example, the parallelogram region 120 includes two rows and two columns of the pixel units 110. In the example illustrated in FIG. 2E, both the aperture ratios of the pixel units 110 arranged in the first direction and the aperture ratios of the pixel units 110 arranged in the second direction increase gradually, that is, in a direction from the intersection point 1011 of the two adjacent line segments 101 to a center of the parallelogram region 120, the aperture ratios of the pixel units 110 increase gradually. In a case where the parallelogram region includes a plurality of rows and a plurality of columns of the pixel units, both the aperture ratios of the pixel units 110 arranged in the first direction and the second direction increase gradually, so that when the parallelogram region plays a function of display, the sawtooth shape is weakened better, thus the visual effect of the display region is improved better.

Figure 2G:
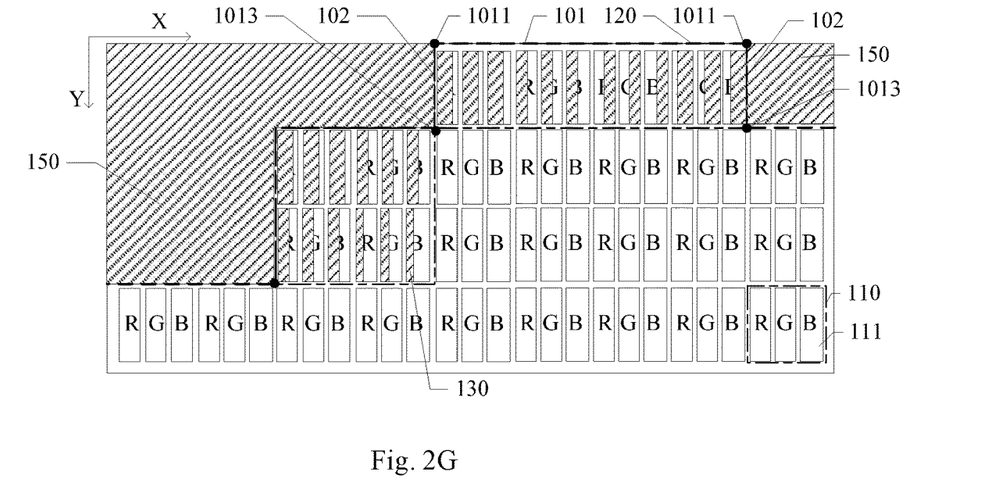
FIG. 2G is a partial planar view of an edge of a display region in a display panel provided by further another example of an embodiment of the present disclosure.

For example, FIG. 2G is a partial planar view of an edge of a display region in a display panel provided by further another example of an embodiment of the present disclosure. For example, as illustrated in FIG. 2G the parallelogram region 120 provided by the example illustrated in FIG. 2G includes one row and four columns of the pixel units 110, and an overlapping portion, overlapping with the edge of the display region 100, of an edge of the parallelogram region 120 includes one first line segment 101 extending in the row direction and two second line segments 102 extending in the column direction. The end point 1013, other than the intersection point with the first line segment 101, of the second line segment 102 is connected with a line segment extending in the row direction in another parallelogram region, that is, the second line segment 102 and other line segments connected to the second line segment in the edge of the display region are not on the same straight line. The row direction and the column direction mentioned above can be interchangeable.

In the parallelogram region 120, in two directions respectively from two intersection points 1011 of the first line segment 101 and the two second line segments 102 to a midpoint of the first line segment 101 (the two directions are respectively an X1 direction and an X2 direction, and the midpoint of the first line segment 101 is a cut-off point of the X1 direction and the X2 direction), the aperture ratios of the pixel units 110 increase gradually, thus, upon the display region playing the function of display, a sawtooth shape at a position of the intersection points 1011 of the first line segment 101 and the two second line segments 102 can be weakened, so that the sawtooth shape at the edge of the display region is hardly recognized by naked eyes.

For example, in the example illustrated in FIG. 2G in the two directions respectively from the two intersection points 1011 of the first line segment 101 and the two second line segments 102 to the midpoint of the first line segment 101, that is, in both of the two directions respectively from two end points 1011 of the first line segment 101 to the midpoint of the first line segment 101, the aperture ratios of the pixel units 110 increase gradually, but the aperture ratios of two pixel units 110 which are closest to the two end points 1011 can be the same or different, and a change rate of the aperture ratios of the pixel units 110 arranged in the X1 direction and a change rate of the aperture ratios of the pixel units 110 arranged in the X2 direction can be the same or different, and the aperture ratios of two pixel units 110 which are closest to the midpoint of the first line segment 101 at two sides of the midpoint of the first line segment 101 can be the same or different, and the example is not limited thereto.

For example, the display panel is described taking that the parallelogram region 120 illustrated in FIG. 2G includes even rows or even columns of pixel units as an example, and at least one embodiments of the present disclosure is not limited thereto.

For example, in a case where the parallelogram region 120 includes at least one row and odd columns of the pixel units 110 or the parallelogram region 120 includes at least one column and odd rows of the pixel units 110, the change trend of the aperture ratios of the pixel units 110 is the same as the change trend described above, and an aperture ratio of the pixel unit 110 at the midpoint of the first line segment 101 is the greatest.

For example, as illustrated in FIG. 2A, each of the pixel units 110 in the parallelogram region 120 includes a light-shading structure 130, and light-shading areas of light-shading structures 130 of the pixel units 110 arranged in the first direction decrease gradually or/and light-shading areas of light-shading structures 130 of the pixel units 110 arranged in the second direction decrease gradually, so that the aperture ratios increase gradually.

For example, in the embodiment illustrated in FIG. 2A, the light-shading areas of the light-shading structures 130 of the pixel units 110 arranged in the second direction (the Y direction) decrease gradually, so that the aperture ratios of the pixel units 110 arranged in the second direction increase gradually.

For example, in the embodiment illustrated in FIG. 2E, in the parallelogram region 120, the light-shading areas of the light-shading structures 130 of the pixel units 110 arranged in the first direction (the X direction) decrease gradually, so that the aperture ratios of the pixel units 110 arranged in the first direction increase gradually.

For example, in the embodiment illustrated in FIG. 2F, in the parallelogram region 120, both the light-shading areas of the light-shading structures 130 of the pixel units 110 arranged in the first direction and the second direction decrease gradually, so that both the aperture ratios of the pixel units 110 arranged in the first direction and the second direction increase gradually.

For example, as illustrated in FIG. 2A, a light-shading layer 140 is between adjacent ones of the pixel units 110 (adjacent ones of the sub-pixel units 111). For example, a black matrix is between the adjacent ones of the pixel units 110.

For example, as illustrated in FIG. 2A, the light-shading layer 140 between the adjacent ones of the pixel units 110 and the first light-shading layer 150 outside the edge of the display region 100 are made of the same material and/or are formed using the same mask in the same patterning process.

For example, both the light-shading layer 140 between the adjacent ones of the pixel units 110 and the first light-shading layer 150 outside the edge of the display region 100 are black matrixes.

For example, as illustrated in FIG. 2A, the light-shading structure 130 includes at least one sub light-shading structure 131 extending in the column direction, and a shape of the sub light-shading structure 131 is the same as a shape of a sub light-shading layer 141 extending in the column direction included in the light-shading layer 140, and a size of the sub light-shading structure 131 is the same as a size of the sub light-shading layer 141.

For example, the light-shading layer 140 includes the sub light-shading layer 141 between the adjacent ones of the pixel units 110 (adjacent ones of the sub-pixel units 111) arranged in the row direction, and both a material of the sub light-shading structure 131 and a material of the sub light-shading layer 141 can be a material used for making the black matrix.

For example, the sub light-shading structure 131 and the sub light-shading layer 141 are formed by using the same mask in the same patterning process, so that process steps are saved, and at least one embodiment of the present disclosure is not limited thereto.

For example, as illustrated in FIG. 2A, in the parallelogram region 120, the light-shading structure 130 in the pixel unit 110 close to the intersection point 1011 includes a plurality of sub light-shading structures 131 extending in the column direction and arranged in the row direction, and the plurality of sub light-shading structures 131 are arranged continuously in the row direction, that is, no space exists between adjacent ones of the plurality of sub light-shading structures 131 in the row direction.

Figure 3A:
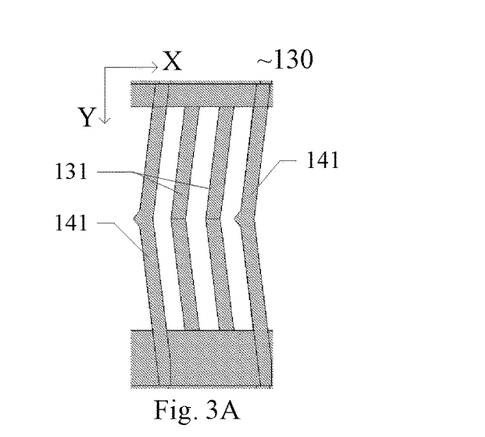
FIG. 3A is a schematic diagram of a light-shading structure provided by an example of an embodiment of the present disclosure.

For example, FIG. 3A is a schematic diagram of a light-shading structure provided by at least one example of an embodiment of the present disclosure. As illustrated in FIG. 3A, the light-shading structure 130 in each of the pixel units in the parallelogram region includes a plurality of sub light-shading structures 131 extending along the column direction, and the plurality of sub light-shading structures 131 are spaced apart from each other, that is, a space exists between the adjacent ones of the sub light-shading structures 131. In the example illustrated in FIG. 3A, the aperture ratio of each of the pixel units 110 can be accurately adjusted by adjusting an amount and a width of the sub light-shading structures.

Figure 3B:
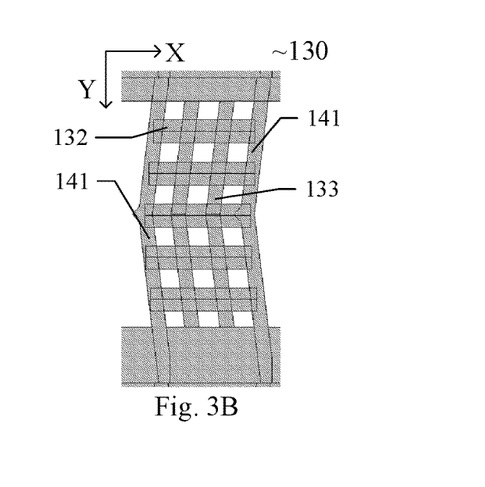
FIG. 3B is a schematic diagram of a light-shading structure provided by another example of an embodiment of the present disclosure.

FIG. 3B is a schematic diagram of a light-shading structure provided by another example of an embodiment of the present disclosure. As illustrated in FIG. 3B, in the parallelogram region, the light-shading structure 130 includes at least one first sub light-shading structure 132 extending in the row direction and at least one second sub light-shading structure 133 extending in the column direction.

For example, as illustrated in FIG. 3B, the light-shading structure 130 includes a plurality of the first sub light-shading structures 132, and in the column direction, the plurality of the first sub light-shading structures 132 are arranged continuously or spaced apart from each other. The example illustrated in FIG. 3B illustrates a case where the plurality of the first sub light-shading structures 132 are spaced apart from each other. In this case, only one second sub light-shading structure 133 can be provided, or a plurality of second sub light-shading structures 133 can be provided, and the example is not limited thereto.

For example, as illustrated in FIG. 3B, the light-shading structure 130 includes a plurality of the second sub light-shading structures 133, and in the row direction, the plurality of the second sub light-shading structures 133 can be arranged continuously or spaced apart from each other. The example illustrated in FIG. 3B illustrates a case where the plurality of the second sub light-shading structures 133 are spaced apart from each other. In this case, only one first sub light-shading structure 132 can be provided, or a plurality of first sub light-shading structures 132 can be provided, and the example is not limited thereto.

For example, as illustrated in FIG. 3B, the example illustrates that the light-shading structure 130 includes a plurality of first sub light-shading structures 132 and a plurality of second sub light-shading structures 133, and both the plurality of first sub light-shading structures 132 and the plurality of second sub light-shading structures 133 are spaced apart from each other, and the example is not limited thereto.

For example, in a case where the light-shading structure 130 includes the plurality of first sub light-shading structures 132 and the plurality of second sub light-shading structures 133, both the plurality of first sub light-shading structures 132 and the plurality of second sub light-shading structures 133 can be arranged continuously or spaced apart from each other. In the example illustrated in FIG. 3B, the aperture ratio of each of the pixel units can be accurately adjusted by adjusting an amount and a width of the first sub light-shading structure and the second sub light-shading structure.

Another embodiment of the present disclosure provides a display device including any one of the display panels provided the at least one embodiment of the present disclosure, and the sawtooth shape at the edge of the display region can be weakened by the display device, so that when the display region plays the function of display, the visual effect at the edge of the display region is improved.

For example, the display device can be a display device such as a liquid crystal display device, an organic light-emitting diode (OLED) display device, and any product or component having a display function, such as a television, a digital camera, a mobile phone, a watch, a tablet computer, a notebook computer, and a navigation device that including the display device.

For example, the display device can be a variety of display devices with an irregular display panel, and no limitation is imposed to this in the embodiments of the present disclosure.

The following should be noted:

(1) only the structures involved in the embodiments of the present disclosure are illustrated in the drawings of the embodiments of the present disclosure, and other structures may refer to usual designs;

(2) the embodiments and features in different embodiments of the present disclosure may be combined in case of no conflict to obtain new embodiments.

(3) for the sake of clarity, the thicknesses of layers or regions are amplified. It is acknowledged that when a component such as a layer, a film, a region or a substrate is said to be "above" or "below" another element, the element may be "directly" located "above" or "below" the another element, or an intermediate element may exist between the element and the another element.

What have been described above are only specific implementations of the present disclosure, the protection scope of the present disclosure is not limited thereto. The protection scope of the present disclosure should be based on the protection scope of the claims.

What is claimed is:

1. A display panel, comprising:
a plurality of pixel units arranged in a row direction and a column direction, wherein the display panel comprises a display region,
an edge of the display region comprises a fold line formed by connecting a line segment extending in the row direction and a line segment extending in the column direction,
a parallelogram region formed in the display region taking two adjacent line segments as adjacent sides comprises a plurality of rows and at least one column of the pixel units, or at least one row and a plurality of columns of the pixel units, and a direction from an intersection point of the two adjacent line segments to an end point of one of the two adjacent line segments other than the intersection point is a first direction, a direction from the intersection point of the adjacent two line segments to an end point of the other one of the two adjacent line segments other than the intersection point is a second direction; in the parallelogram region, aperture ratios of the pixel units arranged in at least one selected from the group consisting of the first direction and the second direction increase gradually, wherein each of the pixel units comprises a plurality sub-pixels of multiple colors arranged in the row direction, and in the parallelogram region, each sub-pixel in each of the pixel units has a same aperture ratio;

a light-shading layer is between adjacent ones of the pixel units, and a material of the light-shading structure is the same as a material of the light-shading layer; each of the pixel units in the parallelogram region comprises a light-shading structure, and light-shading areas of light-shading structures of the pixel units arranged in at least one selected from the group consisting of the first direction and the second direction decrease gradually, so that the aperture ratios increase gradually; and wherein the light-shading structure comprises at least one sub light-shading structure extending in the column direction, the light-shading layer comprises a plurality of sub light-shading layers extended in the column direction, and the sub light-shading structure has a same shape and a same size as one of the plurality of sub light-shading layers.

2. The display panel according to claim 1, wherein an overlapping portion of an edge of the parallelogram region and the edge of the display region comprises one first line segment extending in the row direction and two second line segments extending in the column direction; in the parallelogram region, two end points of the first line segment are respectively connected with the two second line segments, and in a direction from any end point of the first line segment to a midpoint of the first line segment, the aperture ratios of the pixel units increase gradually.

3. The display panel according to claim 1, wherein a material of the light-shading structure is the same as a material of the light-shading layer.

4. The display panel according to claim 1, wherein the light-shading structure comprises a plurality of sub light-shading structures each of which extends in the column direction, and in the row direction, the plurality of sub light-shading structures are arranged continuously or spaced apart from each other.

5. The display panel according to claim 1, wherein the light-shading structure comprises at least one first sub light-shading structure extending in the row direction and at least one second sub light-shading structure extending in the column direction.

6. The display panel according to claim 5, wherein the light-shading structure comprises a plurality of first sub light-shading structures, and in the column direction, the plurality of first sub light-shading structures are arranged continuously or spaced apart from each other.

7. The display panel according to claim 5, wherein the light-shading structure comprises a plurality of second sub light-shading structures, and in the row direction, the plurality of second sub light-shading structures are arranged continuously or spaced apart from each other.

8. The display panel according to claim 1, wherein a shape of the display region comprises a non-rectangular shape.

9. A display device, comprising the display panel according to claim 1.

10. The display panel according to claim 1, wherein one of the plurality of sub light-shading layers is provided between every two sub-pixels adjacent in the row direction;

along the column direction, a count of the sub light-shading structure comprised in the light-shading structure in each pixel unit in the parallelogram region decreases gradually.

11. The display panel according to claim 1, wherein one of the plurality of sub light-shading layers is provided between every two pixel units adjacent in the row direction;

a count of the sub light-shading structure comprised in the light-shading structure in each sub-pixel in a same row in the parallelogram region is equal.

12. The display panel according to claim 1, wherein the row direction and the column direction are perpendicular to each other, and the parallelogram region is a rectangular region.

13. The display panel according to claim 1, wherein in the parallelogram region, aperture ratios of the sub-pixels having a same color arranged in at least one selected from the group consisting of the first direction and the second direction increase gradually.

* * * * *